United States Patent [19]

Hulderman et al.

[11] Patent Number: 5,688,618
[45] Date of Patent: Nov. 18, 1997

[54] MILLIMETER WAVE DEVICE AND METHOD OF MAKING

[75] Inventors: Garry N. Hulderman, Riverside; Eugene Phillips, Diamond Bar; Richard J. Swanson, Pomona, all of Calif.

[73] Assignee: Hughes Missile Systems Company, Los Angeles, Calif.

[21] Appl. No.: 446,025

[22] Filed: May 19, 1995

Related U.S. Application Data

[62] Division of Ser. No. 42,449, Apr. 1, 1993, abandoned, which is a continuation of Ser. No. 739,205, Jul. 30, 1991, abandoned, which is a division of Ser. No. 112,330, Oct. 23, 1987, Pat. No. 5,062,149.

[51] Int. Cl.$^6$ .................... G03F 7/00; G03F 9/00
[52] U.S. Cl. .................... 430/22; 430/313; 430/318; 430/321; 216/41
[58] Field of Search .................... 430/22, 257, 258, 430/313, 311, 315, 318, 319, 320, 321, 329; 216/41, 49

[56] References Cited

U.S. PATENT DOCUMENTS

| | | | |
|---|---|---|---|
| 3,668,029 | 6/1972 | Blossick | 156/11 |
| 4,105,493 | 8/1978 | Chauvy | 156/644 |
| 4,215,194 | 7/1980 | Shepherd | 430/323 |
| 4,512,843 | 4/1985 | Miyazaki | 156/644 |
| 4,755,257 | 7/1988 | Yamamoto | 156/631 |

*Primary Examiner*—Kathleen Duda
*Attorney, Agent, or Firm*—Brown, Martin, Haller & McClain

[57] ABSTRACT

A millimeter wave device having a dielectric substrate with a pair of substantially parallel planar surfaces with at least one predetermined millimeter wave circuit pattern formed in a conductive layer located on at least one of the substrate surfaces. A substantially planar conductive channel plate is mounted adjacent the conductive layer on one substrate surface with the channel plate having an aperture overlying each circuit pattern formed in the conductive layer. A substantially planar conductive cover plate is mounted adjacent one of the channel plates so as to form a first cavity in the region defined by the substrate surface, the channel plate aperture and the cover plate. The device may further include a second substantially planar conductive channel plate mounted adjacent the other one of the substrate surfaces with the second channel plate having an aperture corresponding to and aligned with the first channel plate aperture. A second substantially planar conductive cover plate is mounted adjacent the second channel plate so as to form a second cavity in the region defined by the other substrate surface, the second channel plate aperture and the second cover plate. A substantially planar conductive back plate may be mounted adjacent each cover plate to provide support to the device structure. For the production at large quantity, high yield devices, the channel plates, cover plates, and back plates are fabricated by precision techniques such as by photolithography with chemical milling, or electro-discharge machine wire saw fabrication techniques to achieve device high performance operation. In an alternate embodiment of the invention the channel plates, cover plates and back plates are integrally formed for combining photolithography and electroforming techniques.

4 Claims, 10 Drawing Sheets

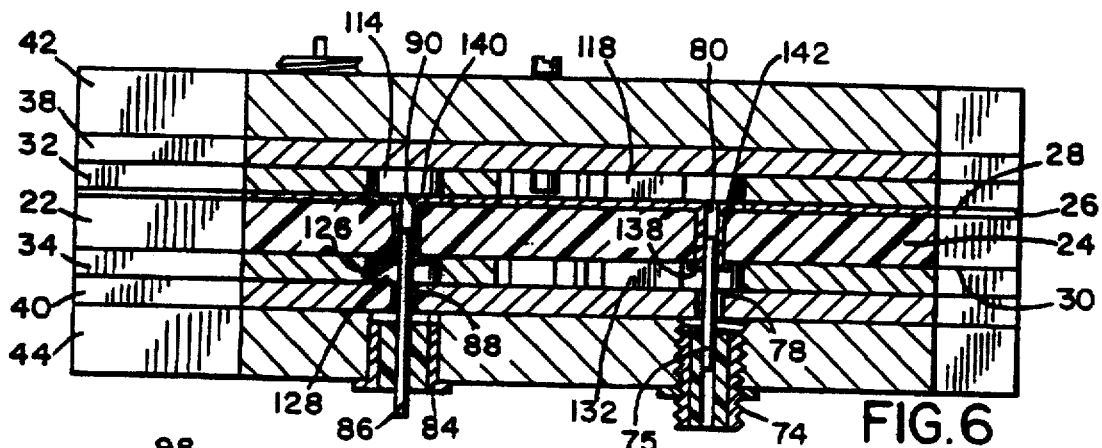
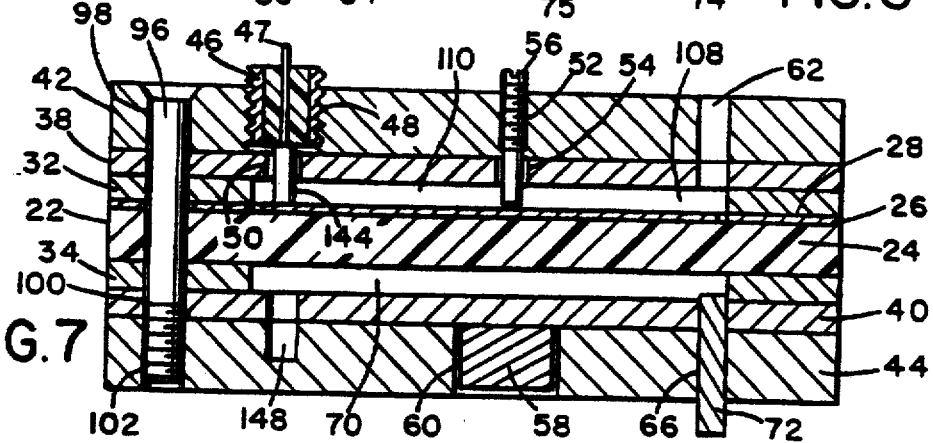
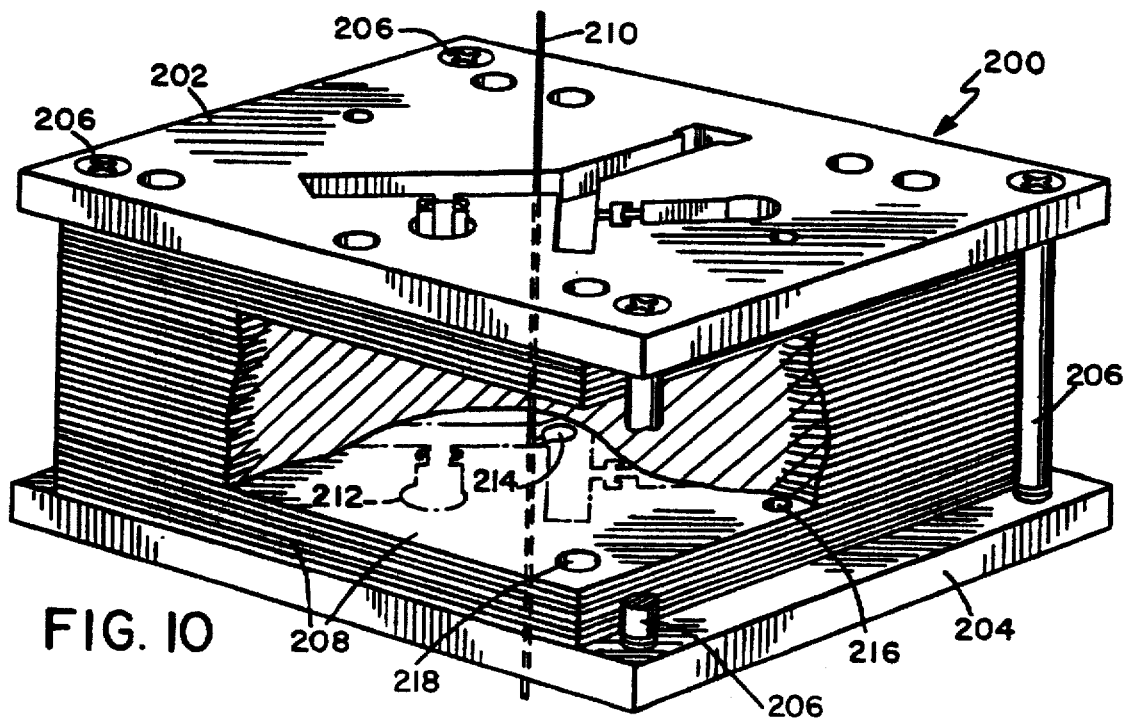

MILLIMETER WAVE DEVICE AND METHOD OF MAKING

This is a divisional of application Ser. No. 08/042,449, filed Apr. 1, 1993 abandoned, which was a Continuation of application Ser. No. 07/739,205 filed Jul. 30, 1991 (abandoned), which was a Divisional of application Ser. No. 07/112,330 filed Oct. 23, 1987, now U.S. Pat. No. 5,062,149.

BACKGROUND OF THE INVENTION

I. Field of the Invention

The present invention relates to millimeter wave device structures and methods of making. More specifically, the wave device featuring a sandwich-type construction and methods of accurate, high through-put, manufacture.

II. Background Art

Current state of the art millimeter wave devices for operating at frequencies employing signals having a wavelength of one to ten millimeters are traditionally constructed in metal waveguide. Typical construction techniques implement the traditional dimensional milling of the metal structure. However, since the waveguide dimensions are proportional to the operating wavelength these dimensions become smaller as the frequency increases. As the frequency of the device increases, the complexities of traditional fabrication and the strict tolerances required become extremely difficult to achieve. In large quantity production schemes, traditional precision milling techniques are extremely cost prohibitive in achieving the precision required for devices in all types of applications.

In an attempt to solve problems of yield, size and weight associated with millimeter wave device structures which are required to provide perform at frequencies in excess of 100 GhZ, several alternate methods of constructing transmission lines and circuits have been employed.

Millimeter wave devices are typically manufactured in microstrip, co-planar waveguide and slot line structures. However, millimeter wave devices manufactured as microstrip, co-planar waveguide and slat line structures are not practical due to the high losses encountered at frequencies above 60 GhZ.

Another approach in fabricating millimeter wave devices is constructing the device in a dielectric image guide structure. However, intolerable levels of radiation and scattering are generated in the dielectric image guide structures. The undesirable effects in these structures are the result of discontinuities caused by devices such as ferrites and diodes contacting the dielectric lines. Of these structures, microstrip, co-planar waveguide, slot line and dielectric image guide, none offer the high performance required in millimeter wave devices which operate at frequencies in excess of 100 GhZ.

Alternate structures for millimeter wave devices have utilized finline or suspended strip line. In these types of structures transmission lines and mixers have shown good performance at the higher millimeter wave frequencies. However, other components manufactured in these structures have had less than successful performance. The limitations upon finline and suspended strip line structures are a result at present construction techniques. These techniques require high precision machining of air channels along with critical positioning of the substrate and ground surfaces. The requirement at high precision machining pose significant problems in large quantity manufacturing, especially on a cost effective basis.

Overall, in the area of millimeter wave devices operating at frequencies in excess of 70 GhZ, little activity in developing accurate devices adaptable to low-cost, high volume production process has been undertaken. A major reason for lack of activity in this area is due to the complexity of fabrication of these high frequency devices. The implementation Of the usual fabrication techniques for millimeter wave devices typically results in poor electrical high frequency performance. Implementation of standard manufacturing techniques in the manufacture of millimeter wave devices, which are only hoped to achieve satisfactory operating characteristics, have projected production costs which art highly excessive in high quantity production runs. Therefore, millimeter wave device usage in large scale programs has been quite limited mainly due to technical difficulties, cost prohibitions of large quantity production, and lack of reproduction accuracy in unit performance.

It is therefore, an object of the present invention to provide a novel and improved high performance millimeter wave device and method of manufacture.

It is yet another object of the invention to provide a method for fabricating high performance millimeter wave integrated circuit devices utilizing high volume fabrication techniques.

SUMMARY OF THE INVENTION

A millimeter wave device having a dielectric substrate with a pair of substantially parallel planar surfaces with at least one predetermined millimeter wave circuit patterns formed in a conductive layer located on at least one of the substrate surfaces. A substantially planar conductive channel plate is mounted adjacent the conductive layer on one substrate surface with the channel plate having an aperture overlying each circuit pattern formed in the conductive layer. A substantially planar conductive cover plate is mounted adjacent one of the channel plates so as to form a first cavity in the region defined by the substrate surface, the channel plate aperture and the cover plate. The device may further include a second substantially planar conductive channel plate mounted adjacent the other one of the substrate surfaces with the second channel plate having an aperture corresponding to and aligned with the first channel plate aperture. A second substantially planar conductive cover plate is mounted adjacent the second channel plate so as to form a second cavity in the region defined by the other substrate surface, the second channel plate aperture and the second cover plate. A substantially planar conductive back plate may be mounted adjacent each cover plate to provide support to the device structure. For the production of large quantity, high yield devices, the channel plates, cover plates, and back plates are fabricated by precision techniques such as by photolithography with chemical milling, or electro-discharge machine wire saw fabrication techniques to achieve device high performance operation. In an alternate embodiment of the invention the channel plates, cover plates and back plates are integrally formed by combining photolithography and electroforming techniques.

BRIEF DESCRIPTION OF THE DRAWINGS

These and other features, objects and advantages of the present invention will be more fully apparent from the detailed description set forth below taken in conjunction with the drawings in which like reference characters identify correspondingly throughout and wherein;

FIG. 6 is a side sectional view taken across line 6—6 of the millimeter wave transceiver of FIG. 4;

FIG. 7 is a side sectional view taken across line 7—7 of the millimeter wave transceiver of FIG. 4;

FIG. 10 is a perspective view of a fixture holding a plurality of air channel plates, partially cut away for illustrative purposes;

DETAILED DESCRIPTION OF THE PREFERRED EMBODIMENTS

Figure 1:
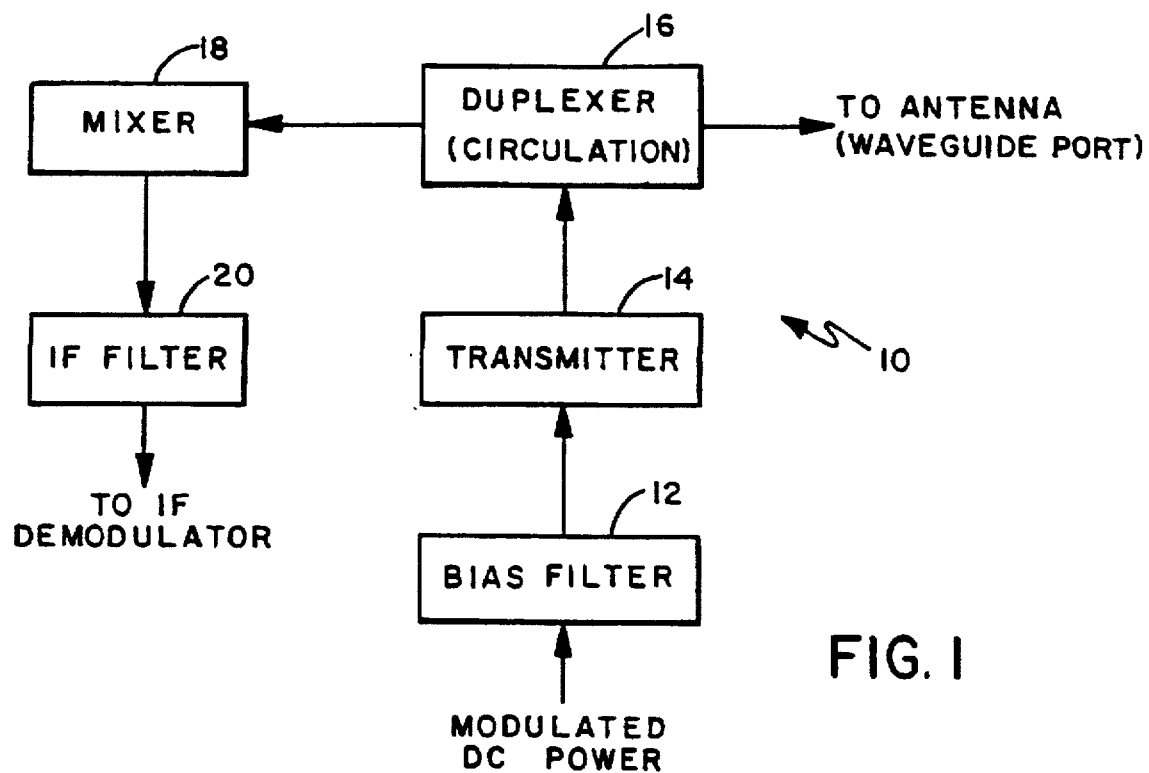
FIG. 1 is a block diagram of a exemplary millimeter wave integrated circuit transceiver.

The present invention comprises a novel and improved millimeter wave device and methods of making. Referring to FIG. 1, there is shown an exemplary block diagram of a millimeter wave transceiver 10. The transceiver of FIG. 1 is but one example of the many types of millimeter wave circuits and the various millimeter wave components which may be manufactured using the construction techniques disclosed herein.

The block diagram at FIG. 1 illustrates the basic function of a millimeter wave frequency modulated continuous wave (FMCW) integrated circuit transceiver 10. In transceiver 10, modulated DC power is applied to bias filter 12 which filters out unwanted AC frequency components and noise from the input DC power. DC power from bias filter 12 is coupled to transmitter 14, which is typically a GUNN diode. The level of the DC voltage provided by the DC power source determines the frequency of oscillation of the GUNN diode. The electromagnetic energy generated by transmitter 14 is coupled through a duplexer or circulator 16. Circulator 16 is used to couple the energy to an antenna (not shown) typically through a waveguide port in the transceiver housing.

In the receiving mode, electromagnetic energy is coupled into the transceiver from the antenna through the waveguide port to circulator 16. Circulator 16 channels the received electromagnetic energy to mixer 18. Mixer 18 mixes the beat frequencies of the received millimeter wave signal. The low frequencies of the mixed signal are then coupled through IF filter 20 to an IF demodulator (not shown).

Figure 2:
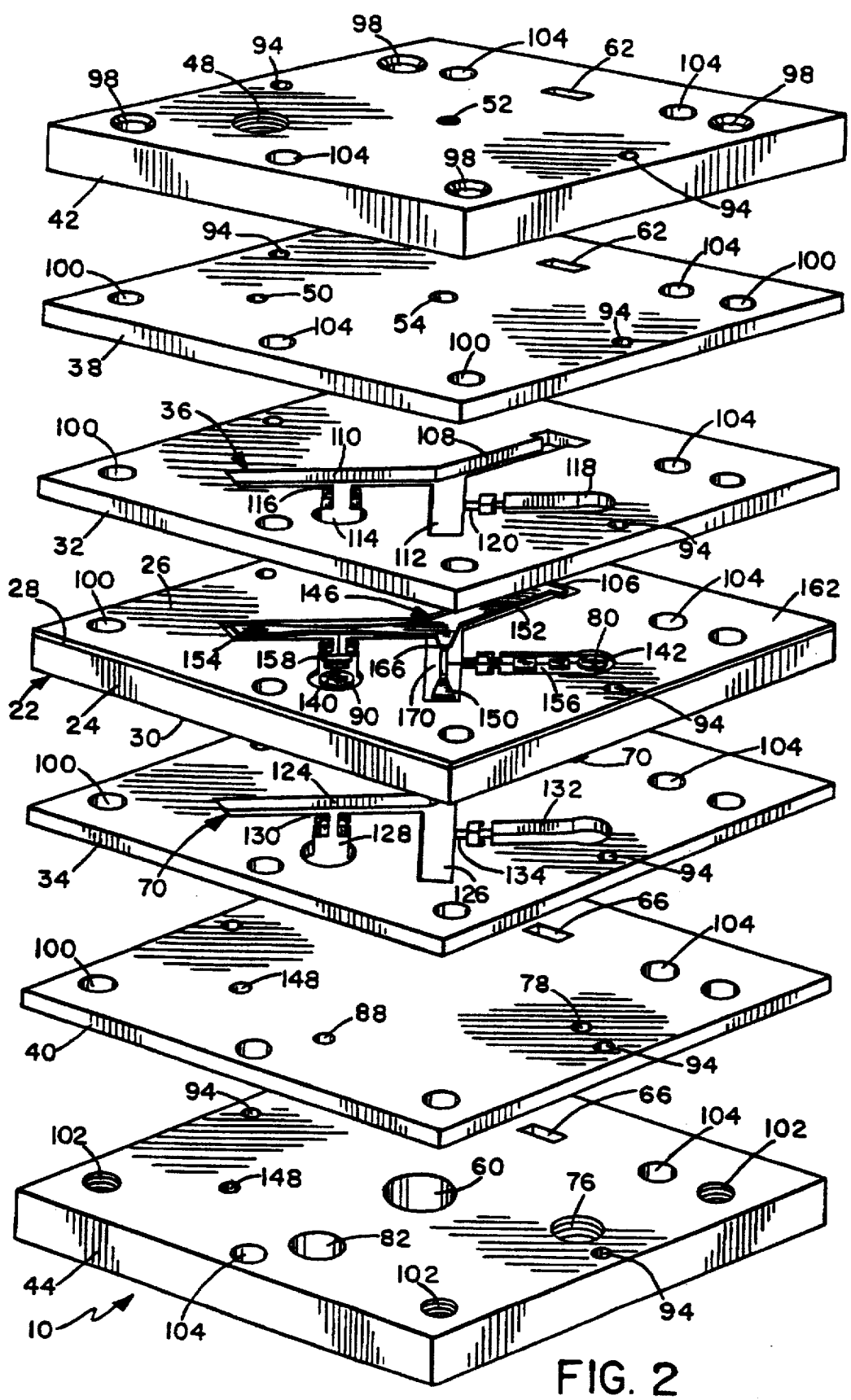
FIG. 2 is a perspective view of the exemplary embodiment of the millimeter wave transceiver, of FIG. 1, constructed in accordance with the present invention, with the transceiver being separated for illustrative purposes.

FIG. 2 illustrates by perspective view the exemplary millimeter wave transceiver of FIG. 1 with the transceiver being separated and certain components removed for purposes of illustration. Components not specifically identified by reference numerals in FIG. 2 are further illustrated in FIGS. 3–7. In FIG. 2, transceiver 10 is configured about circuit board 22 which consists of dielectric substrate 24 and a conductive layer formed on at least one of the surfaces of substrate 24. Circuit board 22 as illustrated in FIG. 2 has substrate 24 with conductive layer 26 formed on a substantially flat upper surface 28 thereof. Substrate 24 also has a substantially flat bottom surface 30 that is parallel to surface 28. A number of predetermined millimeter wave circuit patterns may be formed in conductive layer 26 as described further herein.

Positioned against circuit board 22 are a pair of substantially flat air channel plates or shims 32 and 34. Positioned against conductive layer 26 formed on upper surface 28 is air channel shim 32. Positioned directly against lower surface 30 is air channel shim 34. Air channel shims 32 and 34 have an air channel aperture 36 therein to support millimeter wave propogation along circuit patterns formed on the circuit board. Air channel shims 32 and 34 also contain holes therethrough which provide the necessary feedthrough for components and connectors to the circuit board. Air channel shims 32 and 34 also contain additional holes for alignment and mounting purposes as discussed later.

Respectively mounted adjacent air channel shims 32 and 34 are substantially flat cover plates or shims 38 and 40. Cover shims 38 and 40 overlie the respective air channel shims 32 and 34 so as to form a cavity in the regions above and below the substrate. Holes are provided through cover shims 38 and 40 to provide component placement, through the stack of cover shims and air channel shims, into the cavity regions. Additionally, holes are provided in cover shims 38 and 40 for alignment purposes.

A pair of substantially flat back plates 42 and 44 are respectively mounted adjacent cover shims 38 and 40. Back plates 42 and 44 are used to provide structural rigidity to the transceiver. Back plates 42 and 44 are typically substantially thicker than the air channel shims and cover shims. Back plates 42 and 44 provide structural support to the transceiver to permit attachment of the device to other structures, in addition to the mounting of external structures, such as waveguides, to the drive. Back plates 42 and 44 also provide the necessary support for the mounting of components within the transceiver itself.

The back plates 42,44, cover shims 38,40, air channel shims 32,34, and circuit board 22 each have four side edges forming a rectangular outer periphery, as illustrated in FIG. 2. These plates and shims together form a sandwich-like transceiver of rectangular outer periphery.

A GUNN diode mounting fixture 46 is mounted in threaded hole 48 (FIG. 7) which extends through back plate 42 from a top surface to a bottom surface that is adjacent cover shim 38. The mounting fixture 46 makes electrical contact to backplate 42 and one terminal of the diode (FIG. 7). The other terminal of the diode, coupled to pin 47, extends through an aligned hole 50 in cover shim 38, and into air channel aperture 36. The GUNN diode has one terminal connected to mounting fixture 46 that is electrically connected to backplate 42 and the other terminal contacting the printed circuit pattern formed in conductive layer 26 on upper surface 28 of circuit board substrate 24.

Extending through the aligned holes in back plate 42 and cover shim 38, respectively threaded hole 52 and hole 54, into the air channel aperture 36 adjacent the circuit pattern formed in layer 26, is a ferrite rod 56 (FIG. 7). A cylindrical shaped magnet 58 (FIG. 7) having either a clockwise or counter clockwise polarization defined about central longitudinal axis is mounted directly opposite and aligned with the ferrite rod in hole 60 in back plate 44. Ferrite rod 56 and magnet 58 function as a circulator in transceiver 10.

A waveguide port is configured as a series of rectangularly shaped aligned holes which alignedly extend through back plate 42 and cover shim 38, respectively as hole 62, and intersect with an aligned rectangularly shaped end of air channel aperture 36. Similarly, rectangular shaped holes, holes 66, symmetrically aligned with hole 62 extend respectively through back plate 44 and cover shim 40 where it intersects with an aligned rectangular shaped end of air channel aperture 70. A back short tuner 72 (FIG. 3) is mounted in transceiver 10 through hales 66 and into air channel aperture 70 if necessary.

A coaxial connector 74 (FIG. 3) is mounted in threaded hole 76 in back plate 44 and has a center conductor which extends through an aligned hole 78 in cover shim 40, air channel aperture 132 and through hole 80 in circuit board 22 so as to electrically connect to a mixer circuit pattern formed in conductive layer 26. Connector 74 couples the IF frequency, provided by a mixer circuit pattern and a mixer diode from the received millimeter wave frequencies, external to transceiver 10.

Figure 3:
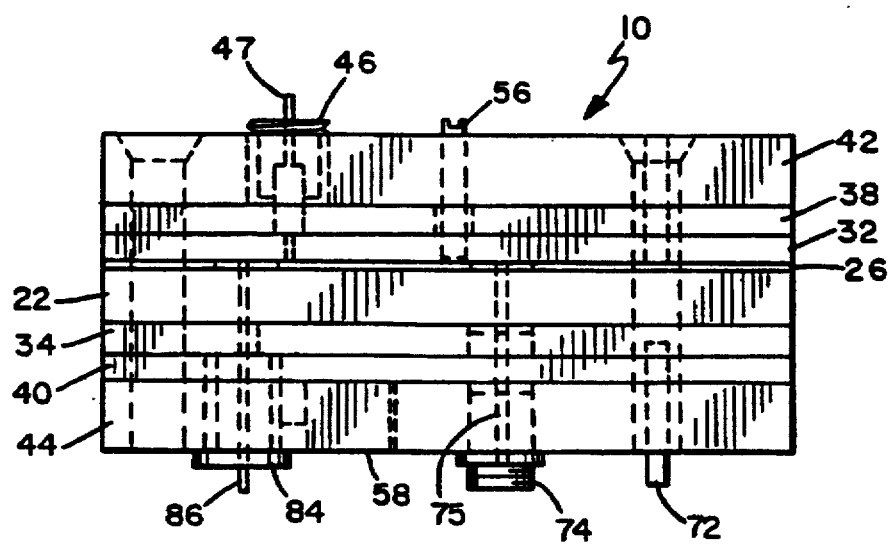
FIG. 3 is a side elevation view of the millimeter wave transceiver of FIG. 2.

Mounted in hole 82 in back plate 44 is connector 84 (FIG. 3). Pin 86 centrally mounted in connector 84 is electrically isolated from the connector housing. Pin 86 extends through aligned hole 88 in cover shim 40, air channel aperture 128, and through hole 90 in circuit board 22 where it connects to a bias filter circuit pattern on conductive layer 26. Externally applied DC power provided to pin 86 is coupled through the bias filter circuit pattern to the GUNN diode with mounting fixture 46 connected to DC power ground.

A pair of alignment pins 92 (FIG. 4) are mounted in back plate 42 and extend through aligned openings 94 through cover shim 38, air channel shim 32, circuit board 22, air channel shim 34 and cover shim 40 where they mate in holes 94 in back plate 44. These alignment pins keep the circuit board cover shims, air channel shims and back plates in alignment for precise positioning of components, holes and air channel apertures.

In the exemplary embodiment of transceiver 10, the structure is configured in a substantially square orientation. The transceiver sandwich-like structure is held together in position by screws 96 which extend through the structure near each corner. Bolts 96 (FIG. 7) extend through aligned holes, countersunk holes 98 in back plate 42, holes 100, cover shim 38, air channel shim 32, circuit board 22, air channel shim 34, cover shim 40 where they engage in the aligned threaded holes 102 in back plate 44.

Figure 4:
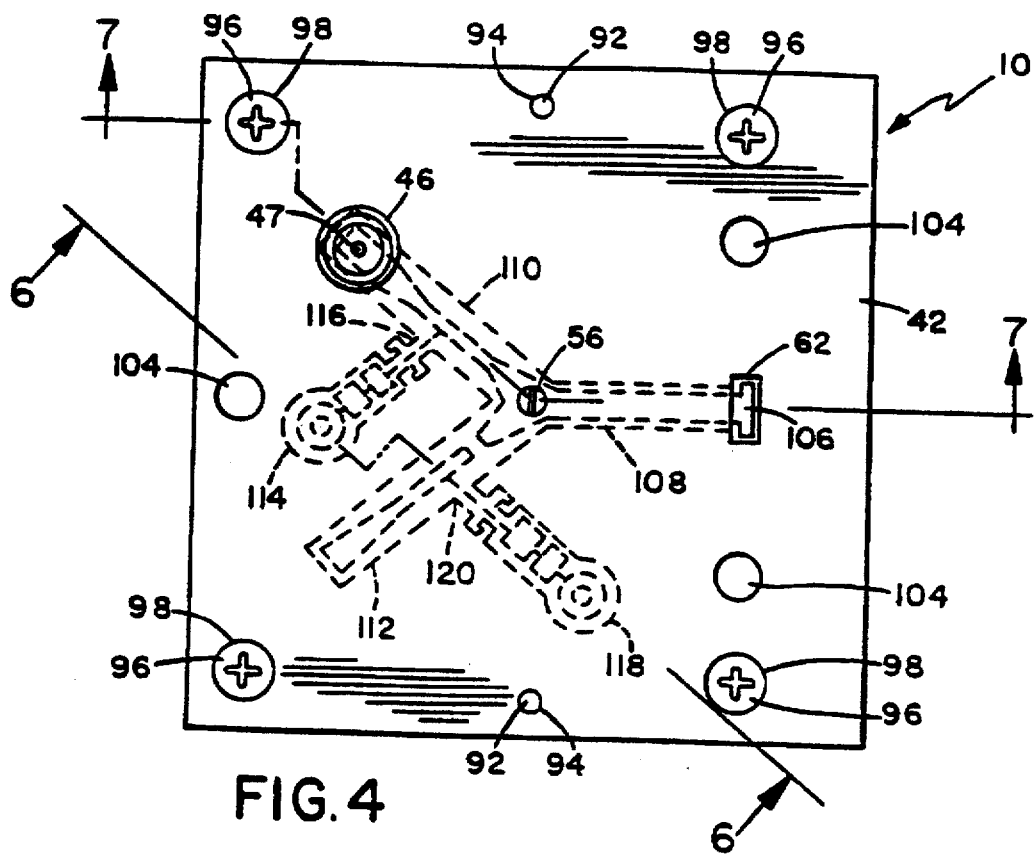
FIG. 4 is a top plan view of the millimeter wave transceiver of FIG. 2.
Figure 5:
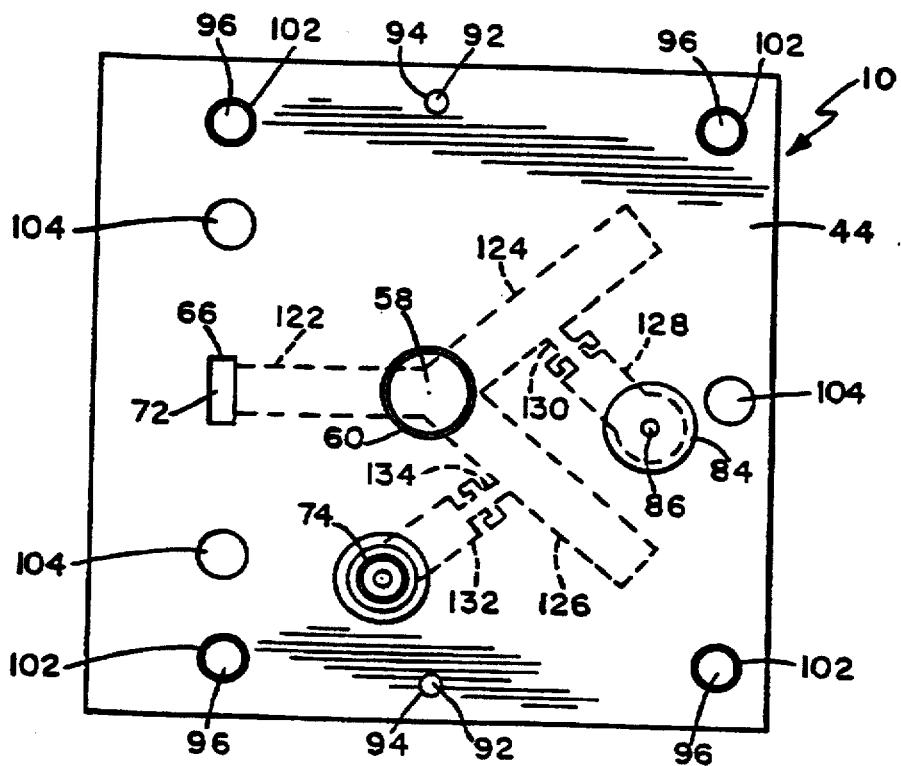
FIG. 5 is a bottom plan view of the millimeter wave transceiver of FIG. 2.

FIGS. 3, 4 and 5 respectively illustrate side elevation, top plan and bottom plan views of the transceiver of FIGS. 1 and 2. Referring to FIG. 3, in addition to FIG. 2, circuit board 22 is sandwiched between air channel shims 32 and 34 with air channel shim 32 being mounted adjacent conductive layer 26. Air channel shims 32 and 34 are respectively sandwiched between cover shims 38 and 40 with circuit board 22 disposed between air channel shims 32 and 34. Similarly, cover shim 38 and 40 are respectively overlaid by back plates 42 and 44.

Back short tuner 72 is mounted in back plate 44 and extends therein through holes 66 and hole 66 in cover shim 40. Back short tuner 72 extends into air channel aperture 70. Coaxial connector 74 is also mounted in back plate 44. Connector 74 has a center pin 75 which is electrically insulated from the connector housing. Pin 75 extends through hole 78 in cover shim 40, air channel aperture 132 and hole 80 in circuit board 22 to make electrical contact only with a circuit pattern in layer 26. Also mounted in back plate 44 is magnet 59 which is a cylindrically shaped magnet sharing a common longitudinal axis with ferrite rod 56. Connector 84 is also mounted in back plate 44 with pin 86 extending through hole 88 in cover shim 40, air channel aperture 128 and hole 90 in circuit board 22 to make electrical contact with a circuit pattern in layer 26.

FIG. 4 illustrates a top plan view of transceiver 10 arid is to be considered with reference to FIG. 2. In FIG. 4, screws 96 are positioned with their head in countersunk holes 98. Screws 96 extend through holes 100 in the transceiver structure and are threadably engaged in the mating threads of holes 102 formed in back plate 44. Screws 96 are utilized to hold together the sandwiched structure of transceiver 10. Mounting holes 104 extend through each of the layers of the sandwiched transceiver structure to facilitate mounting to and with external structure.

A waveguide part is formed by the aligned rectangularly shaped holes 62 which respectively extend through back plate 42, cover shim 38. Holes 62 align with a similar rectangularly shaped end of air channel aperture 36. Electromagnetic energy is coupled in and out of the transceiver structure through this waveguide port which may be attached to an antenna (not shown). The waveguide port is electromagnetically coupled to the transceiver components by transmission line 106, which is a well known microwave circuit pattern that is etched in conductive layer 26. Transmission line 106 extends along substrate 24 where it intersects with other circuit patterns in the region beneath hole 54.

In the particular embodiment illustrated herein the transceiver circulator is comprised of a circuit pattern in conductive layer 26, ferrite rod 56 and magnet 58. Ferrite rod 56 is threadable mounted in hole 52 in back plate 42 and extends into the transceiver structure through hole 54 in cover shim 38 into a cavity defined by the walls of air channel aperture, cover shim 38 and circuit board 22. The end of ferrite rod 56 is spaced apart from and overlies a printed circuit pattern formed in conductive layer 26. Air channel aperture 36 is of a Y-shaped configuration with the ferrite rod 56 positioned at the intersection of the three aperture legs, legs 108, 110 and 112.

Leg 108 overlies a transmission line circuit pattern formed in conductive layer 26. Leg 110 overlies an oscillator circuit pattern formed in conductive layer 26. Leg 112 overlies a mixer circuit pattern formed in conductive layer 26.

At the outward end of leg 108, the end opposite the intersection of legs 108, 110 and 112, is the opening for the waveguide port. Along leg 110, near the outward end thereof, GUNN diode mounting fixture 46 extends through the aperture leg.

Between the intersection of legs 108, 110, and 112 and the outward end of leg 110 a keyhole shaped aperture 114. Aperture 114 extends substantially perpendicular from leg 110 and is connected thereto by a thin channel aperture 116. Aperture 114 overlies the bias filter circuit pattern formed in conductive layer 26. Between the intersection of legs 108, 110 and 112 and the outward end of leg 112 is another keyhole shaped aperture 118. Aperture 116 extends substantially perpendicular from leg 112 and is connected thereto by a thin channel aperture 120. Aperture 118 overlies the IF filter circuit pattern formed in conductive layer 26.

FIG. 5 illustrates a bottom plan view of transceiver 10 and is to be considered with FIG. 2. In FIG. 5, screws 96 are threadably engaged in holes 102 in back plate 44 for rigidly retaining together the sandwich structure of transceiver 10. Magnet 58 is secured in hole 60 in back plate 44 by means well known in the art. Magnet 58 is aligned on a common longitudinal axis with ferrite rod 56. Air channel aperture 70 is formed in air channel shin 34 and is identical in shape, and orientation in the transceiver as is aperture 36.

Aperture 70 has Y-shaped configuration with legs 122, 124, and 126 extending from a center intersection of the legs. In the sandwich structure of transceiver 10, air channel aperture 70 is aligned with air channel aperture 36 such that legs 122, 124 and 126 respectively align with legs 108, 110 and 112. Legs 122, 124 and 126 extend outwardly in a Y-shaped configuration from the center intersection of the legs. The center intersection of the legs is located above magnet 58.

Leg 122 extends outwardly from the intersection of legs 122, 124 and 126 where at its end it has a rectangular shape so as to align with hole 66. Back short timer 72 is mounted in hole 66 and extends into leg 122. Leg 124 extends outwardly from the intersection of legs 122, 124 and 126. Between the end of leg 124 and the intersection of legs 122, 124, leg 124 a keyhole-shaped aperture 128 is formed. Aperture 128 extends substantially perpendicular to leg 124 and is aligned with aperture 114 in the transceiver structure. Aperture 120 is connected to leg 124 by channel 130. Similarly, leg 126 extends outwardly from the intersection of legs 122, 124 and 126. Between the end of leg 126 and the intersection of legs 122, 124 and 126, a keyhole-shaped aperture 132 is formed. Aperture 132 extends substantially perpendicular to leg 126 and is aligned with aperture 118 in the transceiver structure. Aperture 132 is connected to leg 126 by channel 134.

Bias filter connector 84 is mounted in back plate 44 such that pin 66 extends through the region defined by aperture 128. Similarly, coaxial connector 74 is mounted in back plate 44 such that pin 75 extends through the region defined by aperture 132.

FIG. 6 illustrates the transceiver in a sectional view with a cross section taken along line 6—6 of FIG. 4. Back plates 42 and 44 in conjunction with mounting screws 96 clamp with uniform pressure the sandwiched cover shims 38 and 40, air channel shims 32 and 34 and circuit board 22. Back plates 42 and 44 are flat plates typically in the range of 0.1–0.2 inches in thickness and are constructed of a rigid conductive metal such as brass.

Cover shim 38 is mounted adjacent back plate 42 and overlies air channel shim 32. Similarly, cover shim 40 is mounted adjacent back plate 44 and overlies air channel shim 34. Cover shims 38 and 40 are flat plates typically in the range of 0.003–0.005 inches in thickness and are constructed from a conductive metal such as brass. Cover shim 38 acts as a top wall or cover for apertures 36, 114, and 118 of air channel shim 32. Cover shim 40 acts as a bottom wall for apertures 70, 128, and 132 of air channel shim 34. Cover shim 40 includes hale 88 through which pin 86 of bias connector 84 extends into aperture 128. Cover shim 40 also includes bale 78 through which pin 75 of coaxial connector 74 extends into aperture 132.

Air channel shim 32 is mounted between cover shim 38 and conductive layer 26, conductive layer 26 being mounted upon surface 28 of substrate 24. Similarly, air channel shim 34 is mounted between cover shim 40 and surface 30 of substrate 24. Air channel shim 32 and 34 are typically flat conductive metal plates typically in the range of 0.010–0.025 inches in thickness. The interior walls of the apertures formed in air channel shims 32 surround printed circuit patterns formed in conductive layer 26. The aperture width and position relative to the circuit patterns is critical in maintaining an electromagnetic signal therein in the TEM mode at the operating frequency the device. The height, or thickness, of air channel shims 32 and 34 control the characteristic impedance of the overlain printed circuit pattern, at the millimeter wave frequencies. Therefore, the combination of cover shims 38 and 40 respectively overlying air channel shims 32 and 34 define cavities in the air space above a printed circuit pattern that is defined both in terms of width and height. The width of each aperture is of a dimension sufficient to maintain the wave propogated therein in a TEM mode at the characteristic impedance of the circuit pattern. The dimensional aspects of the apertures are relatively well known by those skilled in the art.

Mounted between air channel shims 32 and 34 is circuit board 22. Circuit board 22 is typically constructed of a 0.005 inch thick "teflon" dielectric substrate 24 with a layer of ½ ounce copper on both sides. As illustrated in FIG. 6, the copper layer is illustrated as layer 26 on surface 28 of substrate 24. The layer initially on surface 30 is substantially removed with only pads 126 and 138 and portion 168 remaining. Pad 126 is coupled by plated-through hole 90 in substrate 24 to matching pad 140 of a circuit pattern formed in layer 26. Similarly, pad 138 is electrically connected through plated through hole 80 in substrate 24 to a matching pad 142 of a different circuit pattern in layer 26. As illustrated in FIG. 6, pins 86 and 75 respectively electrically connect to pads 126 and 138. Formed in layer 26 within the boundaries defined by the apertures of air channel shims are circuit patterns which are described later in detail. Outside of the boundaries defined by the apertures of the air channel shims, layer 26 is electrically separated from the circuit patterns so as to function as a circuit ground plane.

FIG. 7 illustrates the transceiver in a sectional view with a cross section taken along line 7—7 of FIG. 4. In FIG. 7, aligned holes 98, 100 and 102 extend through the sandwich structure of the transceiver. Hole 98 is countersunk at the exterior surface of back plate 42 while hole 102 is threaded in back plate 44. Bolt 96 extends through the structure at hole 98, holes 100 and is threadedly engaged in hole 102 in back plate 44. The head of screw 96 fits within the countersunk region of hole 96 at the exterior surface of back plate 42.

GUNN diode mounting fixture 46 is mounted in threaded hole 48 in back plate 42. One terminal of GUNN diode extends through hole 50 in cover shim 38 and has GUNN diode 144 mounted at the end thereof. GUNN diode 144 contacts the circuit pattern formed in layer 26 within leg 110 of aperture 36. The diameter of hole 50 transforms the impedance of the diode to that of the circuit pattern which diode 114 contacts.

Ferrite rod 56 is threadedly mounted in hole 52 in back plate 42 and extends through an aligned hole 54 in cover shin 38. The end of ferrite rod 56 is spaced above the center of the intersection of the legs of a Y-shaped circuit pattern 146 (FIG. 2) that is formed in layer 26 on surface 28.

The waveguide port is formed by the aligned rectangularly shaped holes 62 which extends through back plate 42 and cover shim 38 into aperture 36 at the outer end of leg 108. Back short tuner 72 is mounted in aligned rectangularly shaped holes 66 which are aligned with holes 62. Back short tuner extends in holes 66 through back plate 44, cover shim 40 into air channel aperture 70 at the outermost end of leg 122.

A GUNN diode matching section is formed as cavity 148 which extends from air channel aperture 70, at leg 124, through cover shim 40 and partially into back plate 44. Hole 148 is aligned in the common Longitudinal axis of pin 47 and acts as a oscillator matching section for GUNN diode 144.

Figure 8:
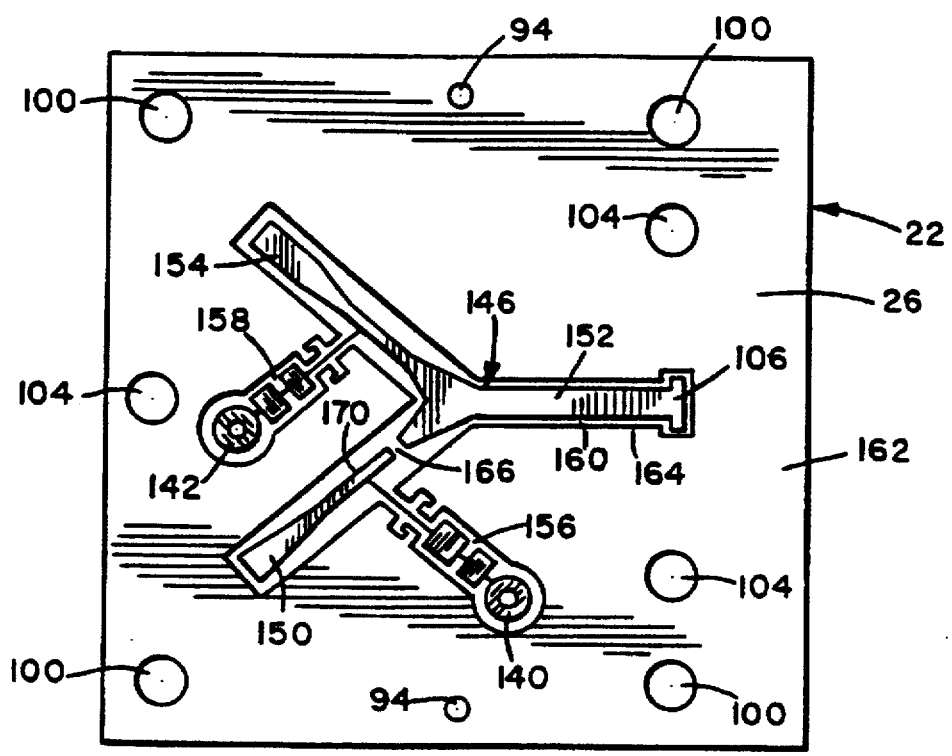
FIG. 8 is a top plan view of the circuit board employed in the millimeter wave transceiver of FIG. 2.
Figure 9:
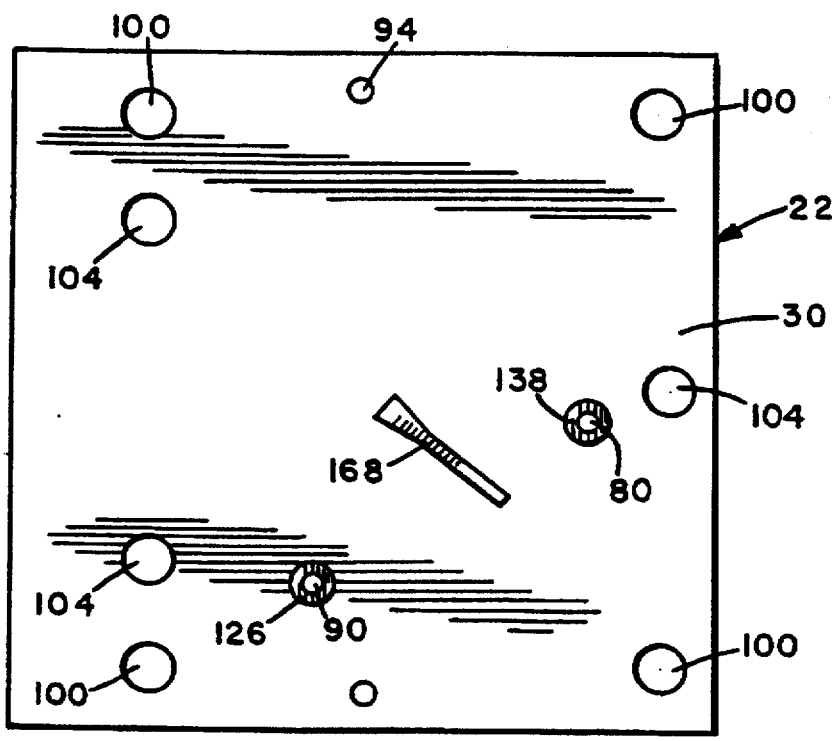
FIG. 9 is a bottom plan view of the circuit board employed in the millimeter wave transceiver of FIG. 8.

Cover shim 40 prevents magnet 58 from falling into air channel aperture in addition to preventing the escape of millimeter wave energy about magnet 58 positioned in hole 60. In certain structures a cover shim would not be necessary when the back plate could serve the same function as the cover shim FIGS. 8 and 9 respectively illustrate top and bottom views of circuit board 22. Layer 30 is typically removed by photolithography and chemical etching techniques well known in the art. These techniques are used to form millimeter wave circuit patterns on the circuit board. As illustrated in FIG. 8, the basic circuit pattern is configured in Y-shaped orientation with the circuit patterns being formed by each of the legs 150, 152 and 154. Additional circuit patterns 156 and 158 respectively extend from legs 150 and 154. The circuit pattern farmed within each leg is surrounded by gap 160 in the conductive layer which exposes surface 28 of substrate 24. Gap 160 in the conductive layer provides electrical isolation of the circuit patterns from the surrounding conductive layer 26 which forms ground plane 162. Edge 164 of ground plane 162 at the meeting of gap 160, is aligned with the interior walls of the air channel apertures.

The circuit pattern formed within leg 154 includes at the outermost end a wide section which is positioned for contacting GUNN diode 144. The circuit pattern line narrows in width as it extends inwardly towards the center of the Y-shaped intersection of the legs 150, 152 and 154. Midway between the end of leg 154 and the intersection of legs 150, 152 and 154 the circuit pattern is electrically contacted by circuit pattern 158. Circuit pattern 158 is the bias filter circuit pattern, an LC and RC filter combination with accompanying interconnect pad 140. Input DC power is provided to a GUNN diode through this circuit pattern. This circuit pattern inhibits the transfer of millimeter wave energy, generated in the transceiver, to pad 140 which is connected to the DC power supply.

The circuit pattern formed by the intersection of legs 150, 152 and 154 forms a circulator circuit in which ferrite rod 56 and magnet 58 are mounted on a common axis perpendicular to the plane of the surface of layer 26. These components and the circuit pattern form the transceiver circulator.

Expanding from the intersection of legs 150, 152 and 154 is the circuit pattern in leg 152 which is a strip of conductive layer 26. The circuit pattern of leg 152 terminates in the region near the end of leg 108 of air channel aperture 36 beneath boles 62 in cover shim 38 and back plate 42. The circuit pattern of leg 152 is transmission line 106 which couples millimeter wave energy between the waveguide port and the circuit components.

Extending from the intersection of legs 150, 152 and 154 is the circuit pattern in leg 150. The strip of conductive layer 26 forming the circuit pattern of leg 150 is a mixer circuit pattern. The mixer circuit pattern includes mixer diode 170 coupled between the strip of conductive layer 26 of the mixer circuit pattern and ground plane 162. At the end opposite the intersection of the circuit pattern legs, the circuit pattern strip of leg 150 is wide. The circuit pattern strip undergoes a transition to a narrow strip approaching the leg intersection. At the transition area in the width of the circuit pattern near the end of leg 150, mixer diode 170 is mounted along the narrow strip portion. Also in the transition area low pass filter circuit pattern 156 intersects the mixer circuit pattern in leg 150. Millimeter wave frequencies reflected along the mixer circuit pattern are such that the reflected or beat frequencies include low frequencies which are permitted to pass through the filter circuit pattern 156 to pad 142. The signal is coupled between pads 142 and circuit pattern 156 by plated-through hole 80 for coupling external to the transceiver by coaxial connector 74.

On leg 150 between the intersection of circuit pattern 156 and the intersection of legs 150, 152 and 154 there is a gap, gap 166, in the conductive layer. Gap 166 provides DC power isolation, of the DC power provided to GUNN diode 144. This DC power is present on the circuit patterns on legs 152 and 154. However, in conjunction with FIG. 9, a conductive strip 168 on surface 30 overlays gap 166. Strip 168 acts as a transformer for coupling millimeter wave energy from the mixer diode circuit to the remaining circuit patterns in legs 152 and 154.

An exemplary embodiment of the frequency modulated continuous wave transceiver is typically 1.0 inch by 1.0 inch along the sides with a thickness of 0.25 inches. The transceiver has a volume of 0.25 cubic inches and a weight of 22 grams. An exemplary unit operates at an average power of 35 milliwatts with a frequency deviation of 50 Mhz. At the rated levels a noise figure of 15 dB at a madulation frequency of 2 KhZis typical. It is envisioned that a varactor-tuned GUNN diode transmitter nay be constructed so as to permit lower noise figures and a larger tuning range.

In the exemplary embodiment, circuit patterns were formed in a conductive layer basically only on a single side of the substrate. However, circuit patterns may be fabricated on bath surfaces with corresponding air channel aperture and component layout.

One method of fabricating the hack plates, cover shims and air channel shims is by utilizing a wire electrode discharge machine (EDM). The EDM wire saw is typically threaded through a pre-drilled hale in one of the metal plates and cuts the metal via a spark gap. For high precision cutting, a numerically controlled table may be used to move the part relative to the cutting wire. The use of the EDM wire saw is especially valuable for precision cutting of multiple pieces in predetermined patterns with high accuracy and reproducability. The EDM wire saw may be used to form the back plates, cover shims and air channel shims.

FIG. 10 illustrates fixture 200 having a top plate 202 and a bottom plate 204 secured together by screws 206. Stacked and clamped between plates 202 and 204 are a plurality of metal plates 208. The plates 208 are of rectangular outer periphery, as illustrated in FIG. 10. A portion of some of metal plates 208 are cut away for purposes of illustrating the cutting action of EDM wire saw cutting wire 210.

Plates 202 and 204 act as a template that typically have predetermined aperture patterns previously formed therein, to prevent redundant cutting of the fixture plates. Holes are also pre-drilled in the fixture prior to stacking the plates therein to avoid redundant hole drilling.

Fixture 200 retains metal plates 208 in a fixed position so that each plate may be identically cut by the EDM wire saw cutting wire 210. Drilled and cut in the fixture, all of plates 208 have the same drilled hole position and wire saw cut aperture pattern.

The aperture pattern 212, indicated in dashed lines on plate 208, has a pre-drilled hole 214 through which cutting wire 210 is inserted. A high voltage is placed upon wire 210 with the fixture being grounded. A spark gap is created by the potential differential between cutting wire 210 and fixture 200. The cutting action of the spark gap results in precision cutting of the pattern. The fixture when placed upon a numerically controlled table under computer control provides precise pattern cutting of the aperture pattern 212. Plate alignment holes such as hole 216 and mounting holes 218 may be formed either by drilling the hole directly or by drilling a pilot hole and cutting the hole to size by using the wire saw.

Figure 11A:
FIGS. 11a–11f illustrate the processing steps in fabricating millimeter wave integrated circuit housing components.

In the alternative, the back plates, cover shims and air channel shims may all be fabricated using chemical Ruling techniques. FIG. 11 illustrates in FIGS. 11A–11F the processing steps in fabricating an air channel shim like that of air channel shims 32 and 34 of FIGS. 2–7. In FIG. 11A, a piece of 0.012 inch thick berylium copper (Be Cu) shim stock 300 is provided for the fabrication of an air channel shim. Shim stock 300 is illustrated in a sectional view which corresponds to the view along line 7–7 of FIG. 7 when completely fabricated. Shim stock 300 has substantially parallel, flat top and bottom surfaces, respectively surfaces 302 and 304.

Shim stock 300 is prepared by brushing surfaces 302 and 304 with a fine brass brush. Shim stock 300 is then dipped into a commonly available copper cleaning solution to remove contamination and particulates from the surfaces. For example, a preferred copper cleaner is that manufactured by KEPRO Company of Fenton, Mo. under the part #CU-3. After immersion in the copper cleaner, shim stock 300 is removed and rinsed in water and dried at 140° F. for 10 minutes.

After drying, shim stock 300 is laminated on surfaces 302 and 304 with photoresist layers 306 and 308. Photoresist layers 306 and 308 are typically a thick, dry film thermoplastic polymer photoresist having a thickness of approximately 0.001 inches. One such photoresist is the negative acting photoresist manufactured by KEPRO under part #DFR-3010. Layers 306 and 308 are rolled on with hot rollers at a temperature of 300° F. and at a pressure of 20 PSI so as to assure good adhesion of the photoresist to surfaces 302 and 304. Shim stock 300 with layers 306 and 308 laminated thereon is then allowed to cure at room temperature for approximately 15 minutes.

Figure 11B:
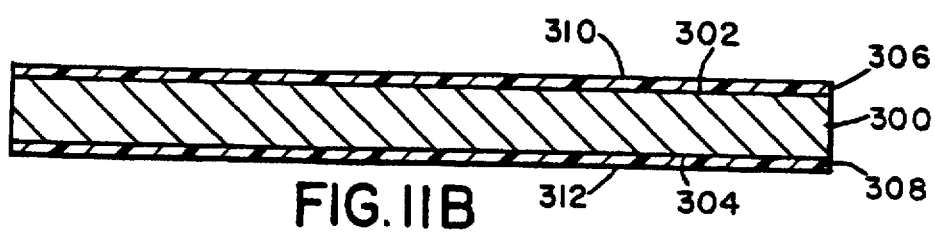

As illustrated in FIGS. 11B, the 0.001 inch thick mylar film typically carried upon the outer surfaces of the stock photoresist is removed. The removal of the mylar film allows a photomask to contact the photoresist directly. Direct contact of a photoresist mask enables a finer pattern definition to be achieved in the exposure of the photoresist to ultraviolet (UV) light. The artwork for exposure of layers 306 and 308, for the particular finished component, is duplicated so that two identical photomasks are generated.

Figure 11C:
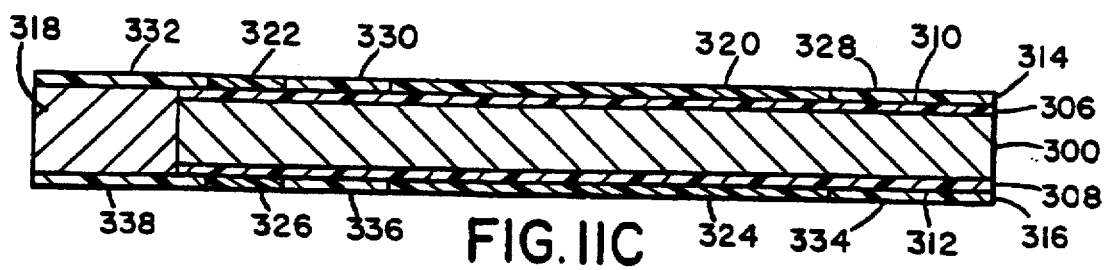

Referring to FIG. 11C, photomasks 314 and 316 are respectively placed upon the respective outer surfaces 310 and 312 of photoresist layers 306 and 308. Photomasks 314 and 316 contain transparent and opaque sections which form an exposure pattern in layers 306 and 308 upon exposure of the layers to UV light. It should be noted that double-sided processing provides more precise etching of the holes and air channel apertures in shim stock 300 than does single level processing. However, single level processing in certain applications may achieve acceptable results.

For double-sided processing of shim stock 300, special attention must be taken in that the transparent and opaque patterns of photomasks 314 and 316 are accurately aligned. The two masks may be aligned over each other using a microscope and then bonded at one edge to spacer 318. In the example illustrated in FIG. 11C, spacer 318 is of a thickness of 0.014 inches with the aligned photomasks 314 and 316 accurately aligned in position upon the respective photoresist layers 306 and 308. As illustrated in FIG. 11C, spacer 318 is placed along one side edge of the rectilinear plane 300 with portions 232 and 338 of the respective photomasks projecting over the upper and lower faces, respectively, of spacer 318. When photomasks 314 and 316 are aligned, portions 332 and 338 are bonded to spacer 318. It should also be noted that the air channel aperture formed in a finished air channel shim must be accurate laid out for the particular application.

Due to the lack of precise control in chemical etching processes the opaque areas of photomask 314 and 316, which overlie the air channel aperture, are 0.010 inches less in width than the width of the air channel aperture in the desired end product. The narrow opaque pattern compensates for the uncontrolled lateral etching of the etching solution as it etches longitudinally through the thickness of the shim.

The photomask covered assembly is then exposed to UV light with the opaque areas, areas 320 and 322 of photomask 314 and areas 324 and 326 of photomask 316, blocking the transmission of UV light to the underlying respective photoresist layer. However, the transparent areas, areas 328, 330 and 332 of photomask 314 and areas 334, 336 and 338 of photomask 316, permit UV light to pass therethrough and cure the respective underlying areas in the photoresist layers. The preferred photoresist material is typically exposed to approximately 60 millijoules of ultraviolet light for approximately (40) seconds.

Photomasks 314 and 316, along with spacer 318, are removed. Shim stock 300, carrying photoresist layers 306 and 308 respectively upon surfaces 302 and 304, is then baked at 140° F. for about 10 minutes.

Photoresist layers 306 and 308 are then developed by placing the photoresist material laminated shim stock in a spray developing tank containing an alkali solution, such as soda ash, as the developer. One such developer is made by KEPRO Company manufacturered under the part #DFD-12G which is a sodium carbonate based developer. This developer is dissolved in water and heated to approximately 104° F. prior to usage in development of the photoresist layers. The photoresist layers are then developed by spraying the heated developer upon layers 306 and 308. The areas of photoresist layer 306 and 308 which were not struck by the UV light because they were beneath the opaque areas of the photomasks, are salable in sodium carbonate. Therefore, these areas are dissolved by the developer and are removed from the surfaces of shim stock 300.

Exposure of the photoresist layers to UV light in areas beneath the transparent areas of the photomasks make these areas insoluble to the developer solution. Exposure of the negative photoresist to UV light causes the photoresist layer polymers to crosslink thereby increasing the molecular weight of the material. Therefore, these light struck or cured areas are resistant to removal by sodium carbonate in the development phase. The light struck portions of photoresist layer 306, areas 340, 342 and 344, respectively located beneath transparent areas 328, 330 and 332 of photomask 314, remain upon surface 302 of shim stock 300 after spraying of the developer upon photoresist layer 306. Similarly, the light struck portions of photoresist layer 308, areas 346, 348 and 350 of layer 303, respectively located beneath areas 334, 336, and 338 9f photomask 316 remain upon surface 304 of shim stock 300 after spraying of the developer upon photoresist layer 308.

Figure 11D:
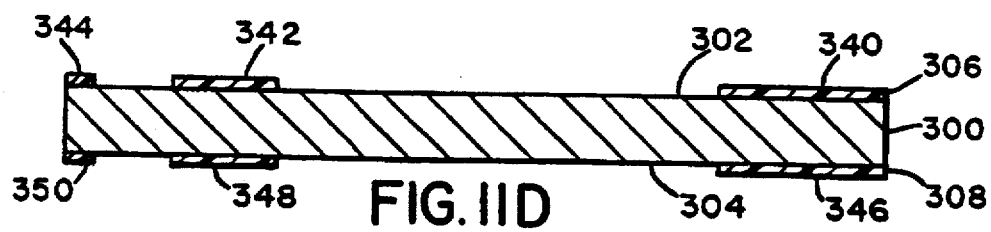

FIG. 11D illustrates the post development areas of photoresist layer 306 with areas 340, 342 and 344 remaining on surface 302 of shim stock 300. Similarly, on surface 304 the post development areas of photoresist layer 308, with areas 346, 348 and 350 remaining on surface 304 of shim stock 300. Therefore, with the uncured areas of photoresist layers 306 and 308 removed by development, surfaces 302 and 304 are exposed according to the pattern defined by photomasks 314 and 316. The developed assembly is then rinsed with water, dried and inspected for flaws in the remaining photoresist layers. Breaks or pinholes in the remaining photoresist areas are filled with commonly well known photoresist pen.

At this stage, shim stock 300 is ready for chemical etching. Shim stock 300 is placed in a spray etching tank containing a solution of ferric chloride (FeCl) which is heated to a temperature of 104° F. For the shim stock 300, as described herein, the total etching time is approximately one minute. However, the part should be checked approximately every twenty seconds to determine when the air channel aperture is fully etched.

Figure 11E:
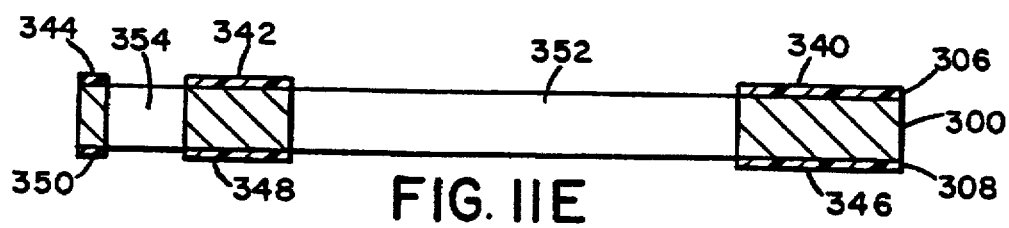

FIG. 11E illustrates etched shim stock 300 with the cured sections of photoresist layers 306 and 308, areas 340, 342, 344, 346, 348 and 350 still remaining upon the surfaces 302 and 304 after etching. The aforementioned areas are resistant to removal or dissolving by the ferric chloride solution which only attacks the exposed metal surfaces of shim stock 300. In FIG. 11E the ferric chloride solution has etched air channel aperture 352 and hole 354 of the desired size and shape in shim stock 300. It should be noted that the etching occurs from both surfaces of shim stock 300 to provide greater resolution in the etching of the aperture and hale in thick shim stock.

Upon completion of the etching stage, shim stock 300 and the remaining areas of photoresist layers 306 and 308 are rinsed with water. The remaining areas of photoresist layers 306 and 308 are stripped off using a heated potassium hydroxide based photoresist stripper solution. One such photoresist stripper commonly used is that sold by KEPRO Company under the part #DFS-126G that is maintained at a temperature of 104° F. for stripping.

Figure 11F:
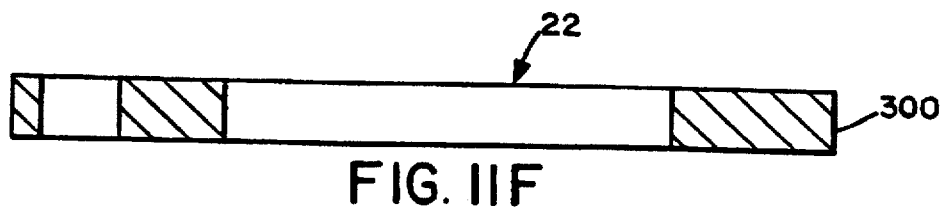

Etched shim stock 300 with the cured photoresist removed, is rinsed off in water and dried. The manufactured shim stock is illustrated in FIG. 11F. The completed etched shim stock 300 forms an air channel shim such as air channel shim 32 that is described in its application with reference to FIGS. 2–7. Although single sided etching is possible in forming the shims and hack plates, higher resolution and faster etching is achieved when doable sided etching processes are used.

Referring to FIG. 12, there is shown, in a series of illustrations 12–12H, the processing of an integrated air channel shim, cover shim, and backplate by using electroforming techniques. The implementation of the below described photolithography and electroforming techniques permits high resolution, precision fabrication of the millimeter wave circuit board housing in mass quantities. FIG. 12A illustrates a metal base 400 having a substantially planar top surface 402. Base 400 may be of a metal such as stainless steel or any other type of metal conventionally used in permanent, or reusable, electroforming mandrel applications.

Figure 12A:
FIGS. 12a–12h illustrate alternate processing steps in fabricating millimeter wave integrated circuit housing components.
Figure 12B:
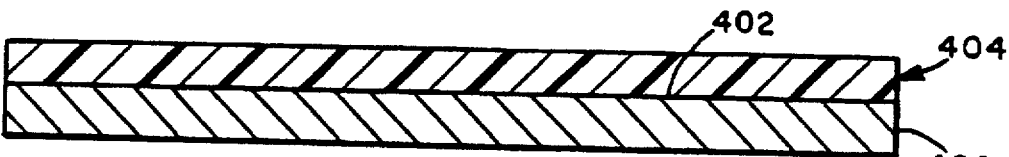

FIG. 12B illustrates a layer of photopolymer in the form of photoresist layer 404, such as a thin film photoresist sold under the trade name "Riston type 218", applied to surface 402. The thickness of photoresist layer 404 can be built up by applying multiple layers of the "Riston type 218" photoresist which is typically 0.002 inches thick. The thickness of the photoresist layer can be built up to at least 0.012 inches by laminating six layers of the "Riston type 218" photoresist on surface 402. In an alternative and preferred mode, a thick film photoresist such as a viscous liquid photopolymer, may be applied to surface 402 as layer 404. The liquid photopolymer may be leveled off with a "doctor blade" or by precision machining after drying to achieve the desired thickness. One type of thick film resist which can be used to generate thicknesses in the range of 0.001–0.080 inches is the "FANTON" series photoresist. The "FANTON" series photoresist is a solvent processable photopolymer resist sold by Armstrong World Industries, Inc. of Lancaster, Pa. Both the "FANTON" and "Riston type 218" photoresist are negative resists. Therefore, the polymer cross-links and increases its molecular weight so as to become impervious to organic solvents when exposed to ultraviolet light.

Figure 12C:
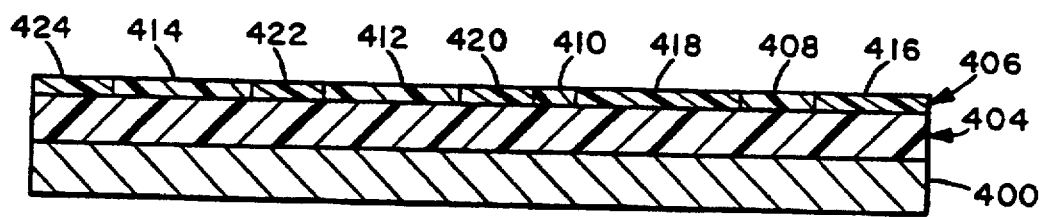

FIG. 12C illustrates a photomask 406 placed upon photoresist layer 404. Photomask 406 contains a predetermined pattern of transparent areas 408, 410, 412 and 414 and opaque areas 416, 418, 420, 422 and 424. Areas 408–424 on mask 406 define a pattern which determines the photoresist areas remaining on base 400 upon subsequent exposure to UV light and development.

When using the photoresist it is generally required to "soft-bake" the photoresist after application to remove solvents in the photoresist layer. With resists such as the "FANTON" series, generally a soft-bake is required when using the series "100" and "105" photoresist. Typically, for thicknesses of approximately 0.010 inches thick, a two hour bake at 75° F. is followed by a two hour bake at 130° F.

Figure 12D:
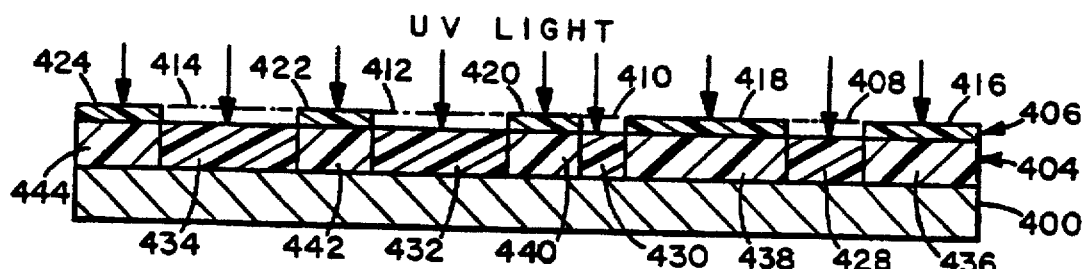

FIG. 12D illustrates the application of UV light to photomask 106. UV light is transmitted through the photomask transparent areas 408, 410, 412, and 414 to underlying areas in photoresist layer 404, areas 428, 430 432 and 434. The UV light is absorbed by the opaque areas 416, 418, 420, 422 and 424 in mask 406 such that the underlying areas of photoresist layer 404, areas 436, 438, 440, 442 and 444, are not exposed. The "FANTON" series photoresist are preferably exposed to UV light from conventional mercury-vapor and xenon type light sources for proper curing. However, optimum exposure time depends upon the light source employed, the ultraviolet light intensity and the distance between the light source and the photoresist layer. For example, a 0.010 thickness "FANTON" photoresist layer would require a UV light intensity of 0.125 joules for an exposure time of 45 seconds.

After exposure to UV Light, the resist is developed. Photomask 406 is removed and the areas of photoresist layer 404 unexposed to the UV light, areas 436, 438, 440, 442 and 444 are removed by development. Development is done with a chlorinated organic solvent, 1—1—1 trichloroethane, at temperatures of 65°–80° F. in a vented tray, a conveyorized spray system or an ultrasonic cleaner operating at 25 KhZ. After removal of the unexposed areas, the photoresist carrying base is washed with clean 1—1—1 trichloroethane. The base is then sprayed with water.

Figure 12E:
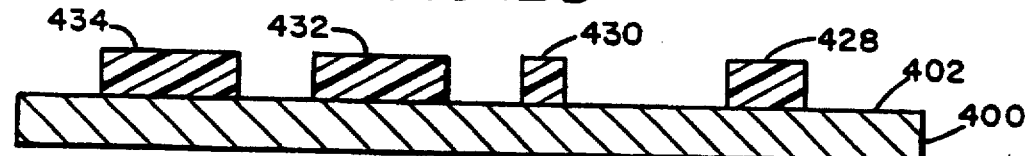

FIG. 12E illustrates the post-development stage where only the exposed portions of photoresist layer 404, areas 428, 430, 432, and 434 remain on surface 402. The removal of the unexposed areas or portion form depressions between adjacent remaining exposed portions. The exposed portions have side walls which define the depressions with the bottom of each depression defined by surface 402. Each remaining exposed portion or area on base 400 has a top surface. The structure formed by base 400 and the remaining exposed portions of photoresist layer 404 on surface 402 forms a photogenerated mandrel which then may be electroplated.

If base 400 is manufactured of a conductive metal other than stainless steel, which has a natural passivation film on its surface which can serve as a separation coating, a special coating such as a nickel or chromium plate, or a tungsten disulfide or titanium nitride coat or other separating coating must be placed on the surface. The application of this separation coating is preferably done before the photoresist is applied to the base.

To electroform the device, the photogenerated mandrel (base with photoresist pattern) is next made electrically conductive by depositing on its surface a thin film of metal such as silver, copper or nickel by an "electroless plating" (chemical reduction) process. These procedures are well known to those skilled in the art of plating on plastics and similar electrical non-conductors. The simplest method suitable for this application consists of immersing the work in a stannous chloride solution followed by rinsing in water. After this "sensitization" step, the work is immersed in, or sprayed with, a solution of a silver complex with a reducing agent. This will deposit a thin film of silver over the workpiece. A further alternative is to paint or spray directly upon the mandrel, conductive metallic paints or lacquers based on silver, copper, graphite or other metals or combinations thereof.

Figure 12F:
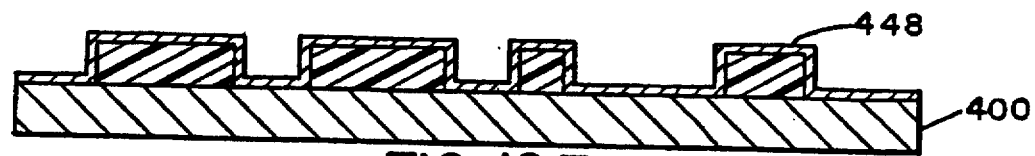

The mandrel structure is next immersed in an electroforming bath and plated so as to form thereupon a layer of plating 448 which form the device housing. The plated electroformed structure upon the mandrel is illustrated in FIG. 12F.

Figure 12G:

FIG. 12G illustrates the electroformed housing 450 as removed from base 400 by prying or lifting. The cured photoresist areas 428, 430, 432 and 434 and are then removed by a photoresist stripping process. Stripping may be accomplished by soaking the structure in a hot resist stripper such as methylene chloride. The stripping is also accompanied with agitation or brushing to remove the remaining cured photoresist material.

Figure 12H:

FIG. 12H illustrates the completed electroformed housing 450. The regions in which the cured photoresist is removed forms precisely dimensioned regions which define interior cavities for components arid air channel apertures. The surfaces of areas 428, 430, 432 and 434 have been utilized to form dimensionally precise interior cavities and air channel apertures of the electroformed housing. These cavity and air channel aperture regions are as illustrated as regions 452, 454, 456 and 458. In essence, the top and side surfaces of the cured photoresist and the exposed portions of surface 402 has formed dimensionally precise air channel apertures and component placement cavities. Structure 450 then may be drilled or further processed for mounting in conjunction therewith an appropriately designed circuit board with circuit patterns formed thereupon for exact registration within the housing.

Using the just described technique, it is envisioned that multiple housings may be electroformed on a single base plate. Therefore, time and cost savings may be realized in fabrication of large quantities of housings.

FIG. 13 illustrates supplemental steps in the forming of the mandrel used to fabricate an electoformed device housing. These supplemental steps enable wherein multiple level structures to be formed.

Figure 13A:
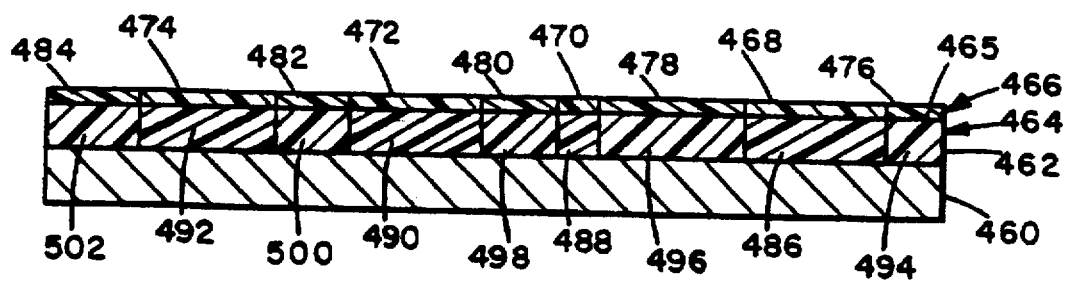
FIGS. 13a–13d illustrate an alternate process for forming a millimeter wave integrated circuit device housing.
Figure 13B:
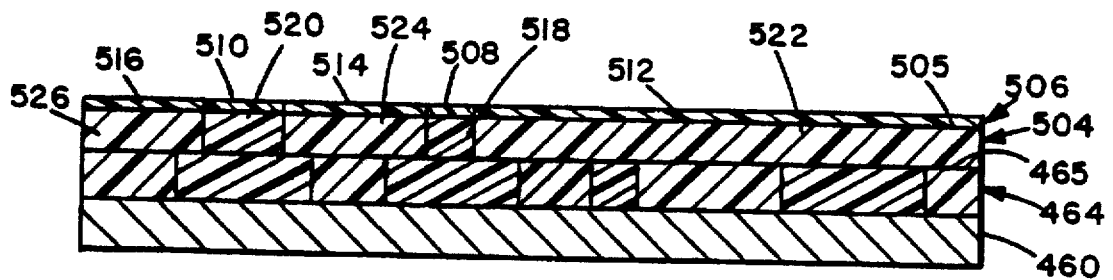

FIG. 13A illustrates base 460 as having formed upon surface 462 photoresist layer 464. Photomask 466 is placed upon surface 465 of photoresist layer 464. Photomask 466 contains transparent areas 468, 470, 472 and 474 and opaque areas 476, 478, 480, 482 and 484. Upon exposure to UV light, the areas in photoresist layer 464 beneath the transparent areas of photomask 466, areas 486, 488, 490 and 492 become insoluble to organic solvents as previously discussed. However, the areas in photoresist layer 464 beneath opaque areas of photomask 466 areas 494, 496, 498, 500 and 502, are uncured and susceptible to removal by organic solvents also as previously discussed.

After exposure to UV light, photomask 466 is removed Upon removal of photomask 466 an additional photoresist layer 504 of a desired thickness is deposited upon surface 465 of photoresist layer 464. Photomask 506 is placed upon top surface 505 of layer 504. Photomask 506 also contains transparent sections, sections 508 and 510, and opaque sections, sections 512, 514 and 516. The transparent sections physically overlie areas in photoresist layer 464 which were previously exposed to UV light.

Upon exposure to UV light, the areas in layer 504 beneath photomask transparent sections 508 and 510 respectively areas 518 and 520 are cured and become impervious to organic solvents. However, the areas in layer 504 beneath photomask opaque areas 512, 514 and 516, respectively areas 522, 524 and 526, are unexposed to UV light and are therefore susceptible to removal by organic solvents.

Figure 13C:
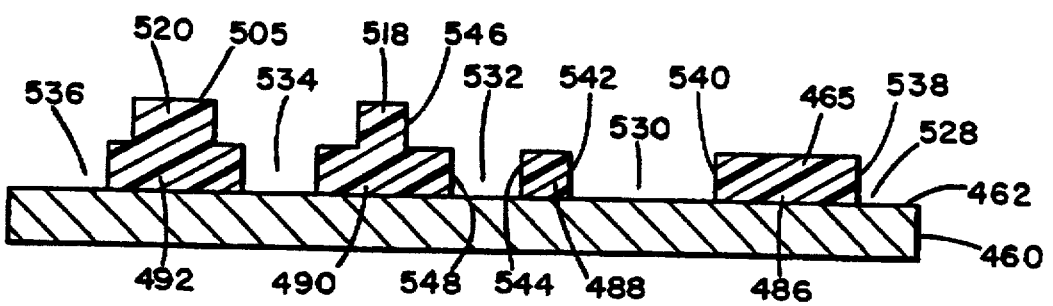

Referring to FIG. 13C, photomask 506 has been removed and the uncured areas of layers 504 and 464 are removed by techniques discussed earlier. As a result areas 486 and 488 in photoresist layer 646 and the combined areas at 490 and 518, respectively of photoresist layers 464 and 504, along with combined areas 492 and 520, respectively of layers 464 and 504 remain. These areas of cured photoresist form depressions which extend downwardly to surface 462 of base 460. Depression 528 is defined by the sidewalls 538 which extends from surface 465 of area 486 to surface 462. Depressions 530 is defined by surface 462 and sidewalls 540 and 542 which respectively extend from surface 465 of areas 486 and 488. Depression 532 is defined by surface 462, and sidewall 544 which extends from surface 465 of area 488 to surface 462. At the other side of depression 532, the depression is defined by the combined structure of areas 490 and 518. The other sidewall of depression 532 formed by sidewall 546 which extends from surface 505 of area 518 downwardly to surface 465 of area 490. The other sidewall is further defined by surface 465 and sidewall 548 which extends from surface 465 downwardly to surface 462. Depression 534 and 536 are similarly defined as was described with reference to depressions 528, 530 and 532.

Figure 13D:
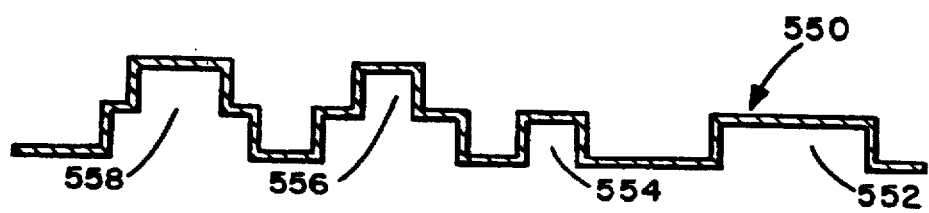

The photogenerated mandrel structure as defined by base 460 and the developed layers 464 and 504 is then processed in a manner as previously described with reference to FIGS. 12E–12H. The resulting structure formed by the mandrel permits a multi-level electroformed housing 550 to be fabricated as illustrated in FIG. 13D. Similarly, as was described in FIG. 12, the cured portions of photoresist layers 464 and 504 define cavities 552, 554, 556 and 558 which provide precise dimensioning of interior cavities and apertures.

Figure 14:
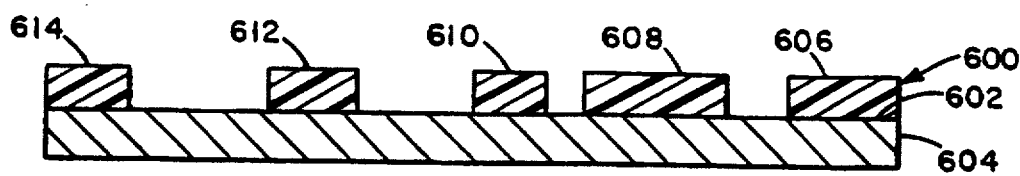
FIGS. 14a–14g illustrate an alternate process for forming a millimeter wave integrated circuit device housing.
Figure 14:
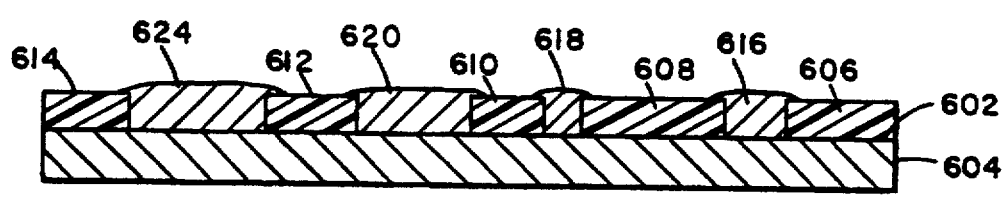
Figure 14:
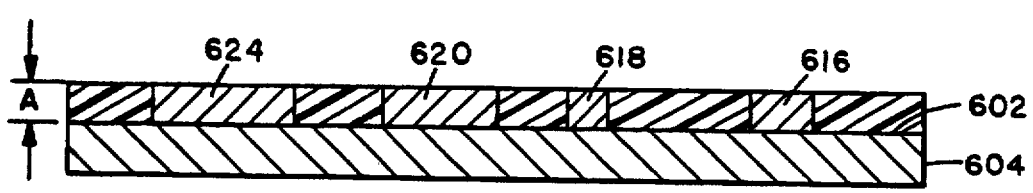
Figure 14:
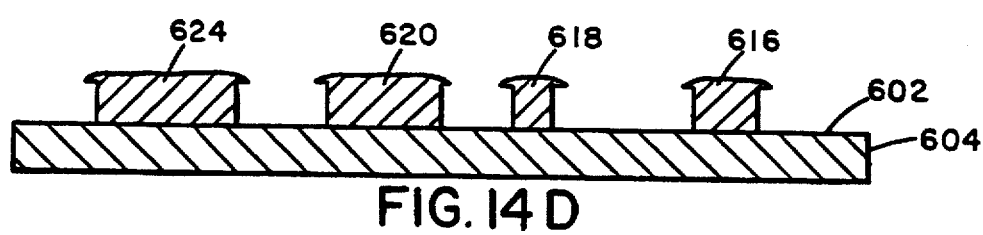
Figure 14:
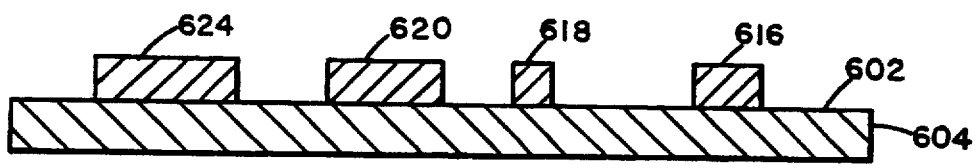
Figure 14:
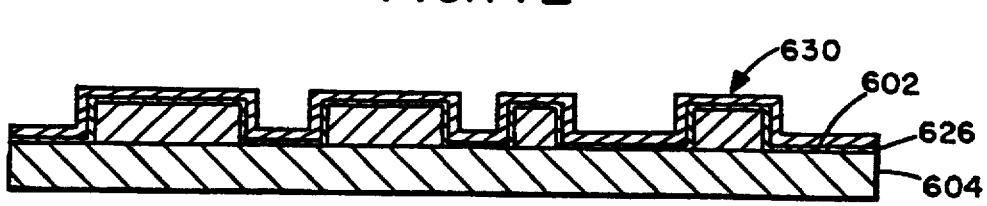
Figure 14:
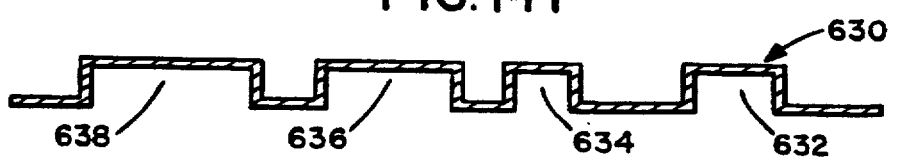

FIG. 14 illustrates ret another embodiment of the integrally formed back plate and thick photoresist pattern wherein the photoresist layer is used to confine the electrodeposition pattern rather than serve as an electroforming mandrel. By this procedure a permanent metal electroforming mandrel is fabricated. In FIG. 14A, a processed photoresist pattern is formed in photoresist layer 600 on surface 602 of base 604. The mechanism by which the layer 600 was deposited and formed with resulting exposed areas 606, 608, 610, 612 and 614, is previously discussed with reference to FIGS. 12 and 13.

After developing the patterned photoresist layer on the base surface 602, the depressions formed between the remaining areas of photoresist layer 600, areas 606, 608, 610, 612 and 614, are filled by metal deposited in an electroforming bath process. FIG. 14B illustrates the deposition of metal area 616 confined within the sidewalls of area 606 and 608 and base surface 602. Similarly, sections 618, 620 and 624 are respectively formed between the sidewalls of areas 608 and 610, areas 610 and 612, and areas 612 and 614.

Due to the lack of precise control of the rate of depositing metal on surface 602, an uneven top surface results in sections 616, 618, 620 and 624. Therefore, the top surface must be machined down to a predetermined precision height, A, above surface 602. The machining of the section top surface gives a flat top surface to each of sections 616, 618, 620 and 624. FIG. 14C illustrates the machined top surfaces of the deposited sections.

Photoresist layer 602 is then removed such that only sections 616, 618, 620 and 624 remain on base 604. In an alternative step, as illustrated in FIG. 14D, the photoresist is removed prior to the precision machining of the dimension A to form the top surface of sections 616, 618, 620 and 624. FIG. 14D illustrates the electroformed mandrel with photoresist layer 600 removed prior to machining of the top surface of the electrodeposited metallic sections.

FIG. 14E illustrates the machined mandrel whether formed as with reference to FIG. 14C or FIG. 14D. In either case, photoresist layer 600 is removed and the top surface of each section is precision machined a predetermined height above base surface 602. Section 616, 618, 620 and 624 in combination with base 604 comprise the electroforming mandrel upon which the housing is then electroformed.

FIG. 14F illustrates a separation coating 626 (exaggerated thickness) formed on the exterior surfaces of section 616, 618, 620 and 624 and the exposed portion of surface 602. This separation coating permits separation of an electroformed housing from surface 602 and sections 616, 618, 620 and 624. Upon forming the separation coating such as tungsten disulfide, titanium nitride, chromium or nickel on surface 602 and the surfaces of the sections, the mandrel is immersed in an electroforming bath. An electroformed housing 630 is then formed over the mandrel.

FIG. 14G illustrates electroformed housing 630 as removed from base 604 and sections 616, 618, 620 and 624. Electroformed housing 630 is removed by prying such that it separates from the mandrel with the sections remaining on the mandrel base. Housing 630 is therefore formed with cavities 632, 634, 636 and 638 being respectively defined by the surfaces and sidewalls of sections 616, 618, 620 and 624.

Figure 15A:
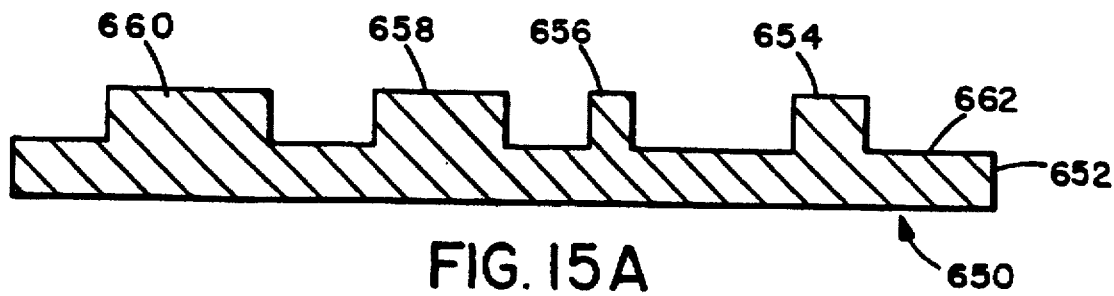
FIGS. 15a–15c illustrate an alternate process for forming a millimeter wave integrated circuit device housing.
Figure 15B:
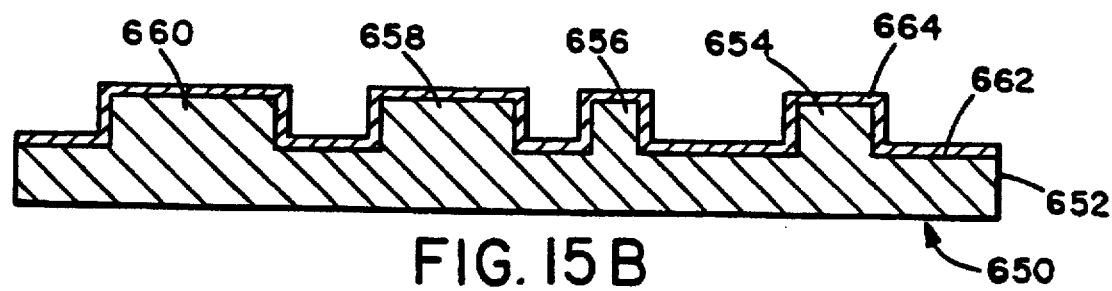
Figure 15C:
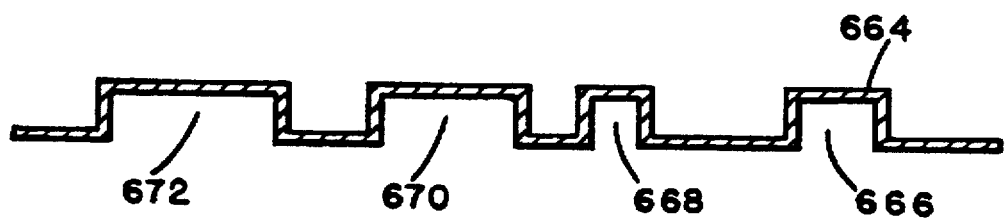

FIG. 15A illustrates a conventionally machined metal mandrel 650 with a bane portion 652 upon which sections, sections 654, 656, 658 and 660 extend above a top surface 662 of base portion 652. FIG. 15B illustrates mandrel 650 with an electroformed housing 664 formed thereupon as discussed with reference to FIGS. 12–14. In cases where a metal mandrel other than stainless steel is implemented, a special separation layer (not shown) most be placed upon the mandrel prior to immersion in the electroforming bath as previously discussed. The separation layer permits easy removal of electroformed housing 664 from mandrel 650. The housing as removed from mandrel 650 is illustrated in FIG. 15C. In FIG. 15C, cavities 666, 668, 670 and 672 are respectively defined by the top surfaces and sidewalls of section 654, 656, 658 and 660.

In any of the processing techniques utilized in fabricating the integrated housing, multiple housings may be formed upon a single base to permit large volume, high quality fabrication. Implementation of these techniques enables the realization of low cost, high precision, mass produced millimeter wave devices.

The previous description of the preferred embodiments are provided to enable any person skilled in the art to make or use the present invention. Various modification to these embodiments will be readily apparent to those skilled in the art, and the generic principles defined herein may be applied to other embodiments without the use of the inventive faculty. Thus, the present invention is not intended to be limited to the embodiment shown herein, but is to be accorded the widest scope consistent with the principles and novel features disclosed herein.

What is claimed is:

1. A method of fabricating a millimeter wave device housing air channel shim, comprising the steps of:
    providing a metallic plate of a thickness in the range of 0.010 to 0.025 inches, having substantially flat parallel top and bottom surfaces and four side edges forming a rectangular outer periphery to said plate;
    placing a layer of photoresist material upon each of said top and bottom surfaces;
    placing a mask, having a predetermined transparent and opaque pattern formed therein, adjacent each photoresist layer, the masks having identical transparent and opaque patterns;
    positioning the masks with their patterns in alignment;
    said plate having a first side edge comprising one of said four side edges and the masks each having a projecting portion which projects outwardly from said first side edge of the plate;
    placing a spacer along said first side edge of the plate, the spacer having an upper face aligned with the photoresist layer placed on said top surface of said plate and a lower face aligned with the photoresist layer placed on said bottom surface of said plate;
    placing said masks in alignment with said projecting portions of said masks projecting over the upper and lower face of said spacer, respectively, and bonding said projecting portions to the respective upper and lower faces of said spacer when said masks are in alignment;
    providing ultraviolet light to said masks, said ultraviolet light passing through said mask transparent patterns into said photoresist layers;
    removing said masks from each photoresist layer;
    developing each photoresist layer so to remove ultraviolet light unexposed portions of each photoresist layer present from said top and bottom surfaces and expose portions of underlying corresponding surfaces; and
    spray etching said metallic plate at said exposed portions of both of said underlying corresponding surfaces to form predetermined apertures through the plate.

2. The method as claimed in claim 1, wherein the photoresist material is a dry chemical photoresist and a plastic film coating on both faces of the photoresist material is removed prior to placing a layer of the photoresist material on each of said top and bottom surfaces, and the masks are placed in direct contact with the dry chemical photoresist material.

3. A method of fabricating a millimeter wave device housing air channel shim, comprising the steps of:

providing a metallic plate of a thickness between 0.010 and 0.025 inches, having substantially flat parallel top and bottom surfaces and tour side edges forming a rectangular outer periphery to said plate;

placing a layer of photoresist material of uniform thickness to cover each of said top and bottom surfaces;

placing a first mask, having predetermined transparent and opaque patterns formed therein, adjacent one of said photoresist layers, and placing a second mask having identical patterns against the other photoresist layer with the patterns in alignment;

said plate having a first side edge comprising one of said four side edges and the masks each having a projecting portion which projects outwardly from said first side edge of the plate;

placing a spacer along said first side edge of the plate, the spacer having an upper face aligned with the photoresist layer placed on said top surface of said plate and a lower face aligned with the photoresist layer placed on said bottom surface of said plate;

placing said masks in alignment with said projecting portions of said masks projecting over the upper and lower face of said spacer, respectively;

bonding said projecting portions to the respective upper and lower faces of said spacer when said masks are in alignment;

providing ultraviolet light to said masks, said ultraviolet light passing through said mask transparent patterns to expose predetermined portions of each photoresist layer to ultraviolet light;

removing said masks from each photoresist layer;

spraying solvent upon each photoresist layer so as to dissolve portions in each photoresist layer unexposed to ultraviolet light;

rinsing each photoresist layer so as to remove dissolved photoresist material from each photoresist layer on said plate; and etching said metallic plate at the remaining exposed portions of each photoresist layer.

4. A method of fabricating a millimeter wave device housing air channel shim, comprising the steps of:

providing a metallic plate of a thickness between 0.003 and 0.005 inches, having substantially flat parallel top and bottom surfaces and four side edges forming a rectangular outer periphery to said plate;

placing a layer of photoresist material to cover both of said top and bottom surfaces;

placing a first mask, having a predetermined transparent and opaque patterns formed therein, adjacent one of said photoresist layers, and placing a second mask having identical patterns against the other photoresist layer with the patterns in alignment;

said plate having a first side edge comprising one of said side edges and the masks each having a projecting portion which projects outwardly from said first side edge of the plate;

placing a spacer along said first side edge of the plate, the spacer having an upper face aligned with the photoresist layer placed on said top surface of said plane and a lower face aligned with the photoresist layer placed on said bottom surface of said plate;

placing said masks in alignment with said projecting portions of said masks projecting over the upper and lower face of said spacer, respectively;

bonding said projecting portions to the respective upper and lower faces of said spacer when said masks are in alignment;

providing ultraviolet light to said masks, said ultraviolet light passing through said mask transparent patterns into said photoresist layers;

removing said masks from each photoresist layer;

developing each photoresist layer so to remove ultraviolet light unexposed portions of each photoresist layer present from at least one of said top and bottom surfaces and expose portions of underlying corresponding surface; and etching said metallic plate at said exposed portions a said underlying corresponding surface.

* * * * *